United States Patent
Seo

(10) Patent No.: US 8,004,180 B2
(45) Date of Patent: Aug. 23, 2011

(54) ORGANIC LIGHT EMITTING DISPLAY AND ITS METHOD OF FABRICATION

(75) Inventor: Chang-Su Seo, Suwon-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 268 days.

(21) Appl. No.: 12/318,750

(22) Filed: Jan. 7, 2009

(65) Prior Publication Data

US 2009/0309493 A1 Dec. 17, 2009

(30) Foreign Application Priority Data

Jun. 12, 2008 (KR) .................. 10-2008-0055253

(51) Int. Cl.
*H01J 1/62* (2006.01)
*H01J 63/04* (2006.01)

(52) U.S. Cl. ........ 313/504; 313/498; 313/506; 313/512; 445/24

(58) Field of Classification Search .......... 313/498–512; 445/23–25
See application file for complete search history.

(56) References Cited

U.S. PATENT DOCUMENTS

| 7,414,362 | B2 | 8/2008 | Chung et al. | |
|---|---|---|---|---|
| 2003/0197466 | A1* | 10/2003 | Yamazaki et al. | 313/504 |
| 2004/0263072 | A1* | 12/2004 | Park et al. | 313/509 |
| 2005/0236629 | A1 | 10/2005 | Lee et al. | |
| 2006/0186804 | A1* | 8/2006 | Sakakura et al. | 313/506 |
| 2008/0252207 | A1* | 10/2008 | Yamazaki et al. | 313/504 |
| 2009/0066236 | A1* | 3/2009 | Sung et al. | 313/504 |
| 2009/0153046 | A1* | 6/2009 | Hayashi et al. | 313/505 |

FOREIGN PATENT DOCUMENTS

| KR | 10-2004-0098138 | 11/2004 |
|---|---|---|
| KR | 10-2007-0070592 | 7/2007 |

* cited by examiner

*Primary Examiner* — Joseph L Williams
*Assistant Examiner* — Kevin Quarterman
(74) *Attorney, Agent, or Firm* — Robert E. Bushnell, Esq.

(57) ABSTRACT

An organic light emitting display is divided into a light emitting region and a non-light emitting region, the non-light emitting region of the organic light emitting display including: a first substrate; a first passivation layer and a second passivation layer sequentially arranged on the first substrate and having a step in an undercut shape; and an auxiliary electrode layer, an El common layer, and a second layer sequentially arranged throughout the non-light emitting region including the first and second passivation layers, the auxiliary electrode layer being shorted to the second layer in the step at the slope of the second passivation layer or shorted to the first passivation layer in the undercut shape arranged under the second passivation layer.

14 Claims, 4 Drawing Sheets

ORGANIC LIGHT EMITTING DISPLAY AND ITS METHOD OF FABRICATION

CLAIM OF PRIORITY

This application makes reference to, incorporates the same herein, and claims all benefits accruing under 35 U.S.C. §119 from an application for Organic Light Emitting Display and Method of Fabricating the Same earlier filed in the Korean Intellectual Property Office on the 12 of Jun. 2008 and there duly assigned Serial No. 10-2008-0055253.

BACKGROUND OF THE INVENTION

1. Field of the Invention

The present invention relates to an organic light emitting display and its method of fabrication, and more particularly, the present invention relates to a top-emission organic light emitting display in which a cathode electrode has a reduced resistance and its method of fabrication.

2. Description of the Related Art

Generally, a light emitting display is a self-luminous display which emits light by electrically exciting fluorescent compounds. The light emitting display has characteristics of low voltage driving, facilitation of slimness, a wide viewing angle, and a fast response speed, which are less favorable in a liquid crystal display, so that it has been spotlighted as a next generation display.

The light emitting display may be divided into inorganic light emitting displays and organic light emitting displays according to whether materials forming a light emitting layer are inorganic matter or organic matter.

An organic light emitting display includes an organic layer with a predetermined pattern formed on a glass substrate or other transparent insulating substrate and anode and cathode electrode layers formed on the upper and lower faces of the organic layer. The organic layer is formed of organic compounds including a light emitting layer.

In the organic light emitting display formed as above, holes injected from the anode electrode supplied with a positive voltage move to the light emitting layer via a hole transportation layer, and electrons are injected from the cathode electrode supplied with a negative voltage via an electron transportation layer into the light emitting layer, when positive and negative voltages are supplied to the anode and cathode electrodes, respectively. Thus, the electrons and the holes are recombined in the light emitting layer to generate exitons, which are changed to a ground state from an excited state. Accordingly, images are formed by fluorescent molecules in the light emitting layer emitting light.

The organic light emitting display may be divided into top-emission and bottom-emission types according to a light emitting direction. Recently, the top-emission type of organic light emitting display has been preferably adopted for large flat displays.

In the case of the top-emission type of organic light emitting display, the anode electrode is formed on the lower portion of the organic layer and the cathode electrode is formed on the upper portion of the organic layer where light is transmitted.

Also, the anode electrode, which is a reflection electrode, is formed of a metal having a high reflectivity, such as Ag, Al, etc. and uses a resonance structure to achieve color reproducibility through high purity color implementation and high efficiency by resonance of light. In the resonance structure, the cathode electrode uses a semi-transparent layer. In the of the top-emission type of light emitting scheme, the cathode electrode having a low work function and semi-transmitting characteristic is needed.

In order to achieve the semi-transmitting characteristic, the cathode electrode needs to be formed thinly. In this case, it is a disadvantage since it results in the cathode electrode having a high resistance.

When operating the organic light emitting display with a current drive, a voltage drop (IR drop) occurs due to the resistance of a line and/or electrode. In particular, in the case of a top-emission type of organic light emitting display having a thin cathode electrode, a voltage drop problem becomes serious due to the high resistance of the cathode electrode, so that the display cannot perform well. In other words, when the cathode electrode has a high resistance, non-uniformity of luminance is severe inside a panel.

SUMMARY OF THE INVENTION

Therefore, it is an object of the present invention to provide an organic light emitting display and its method of fabrication to reduce the resistance of a cathode electrode by structurally shorting the cathode electrode formed on a non-light emitting region to an auxiliary electrode formed under the cathode electrode by an undercut phenomenon during the fabrication process in a top-emission organic light emitting display.

In order to achieve the object, an organic light emitting display according to a first aspect of the present invention is provided, the display including: a light emitting region and a non-light emitting region, the non-light emitting region of the organic light emitting display including: a first substrate; a first passivation layer and a second passivation layer sequentially arranged on the first substrate and having a step in an undercut shape; and an auxiliary electrode layer, an El common layer, and a second layer sequentially arranged throughout the non-light emitting region including the first and second passivation layers, the auxiliary electrode layer being shorted to the second layer in the step at the slope of the second passivation layer or shorted to the first passivation layer in the undercut shape formed under the second passivation layer.

The first passivation layer has a higher etch rate than that of the second passivation layer.

The first passivation layer is formed of an $SiO_2$ material and the second passivation layer is formed of a SiNx material.

Also, the second electrode layer, which is a cathode electrode, is formed of MgAg, and the second auxiliary electrode layer and an anode electrode is formed of ITO/Ag.

Also, a method of fabricating an organic light emitting display according to a second aspect of an embodiment of the present invention is provided, the method including: sequentially forming first and second passivation layers with different etch rates on a first substrate; etching the first and second passivation layers to form a step in an undercut shape; and sequentially forming an auxiliary electrode layer, an ElectroLuminescent (EL) electrode layer, and a second electrode layer throughout a non-light emitting region including the first and second passivation layers, the auxiliary electrode layer being shorted to the second layer in the step at the slope of the second passivation layer or shorted to the first passivation layer in the undercut shape formed under the second passivation layer.

Also, an organic light emitting display according to a third aspect of the present invention is provided, the display includes: a light emitting region and a non-light emitting region, the non-light emitting region of the organic light emitting display including: a first substrate; a first auxiliary electrode layer, a second auxiliary electrode layer, and a third auxiliary electrode layer sequentially formed on the first substrate and having a step in an undercut shape; and an ElectroLuminescent (EL) common layer and a second layer sequentially formed throughout the non-light emitting region including the first, second, and third auxiliary layers, the auxiliary electrode layers being shorted to the second layer in the step corresponding to an end portion of the second auxiliary electrode layer having a projected shape as compared to that of the first and third auxiliary electrode layers.

The first and third auxiliary electrode layers have a higher etch rate than that of the second auxiliary electrode layer, and the first, second, and third auxiliary electrode layers are sequentially formed of Mo/Al/Mo.

Also, a method of fabricating an organic light emitting display according to a fourth aspect of an embodiment of the present invention is provided, the method including: sequentially forming first, second, and third auxiliary electrode layers having different etch rates on a first substrate; etching the first, second, and third auxiliary electrode layers to form a step in an undercut shape; sequentially forming an ElectroLuminescent (EL) electrode layer and a second electrode layer throughout a non-light emitting region including the first, second, and third auxiliary layers, the auxiliary electrode layers being shorted to the second layer in the step corresponding to an end portion of the second auxiliary electrode layer having a projected shape as compared to that of the first and third auxiliary electrode layers.

With the present invention, the cathode electrode formed on the non-light emitting region lowers the resistance of the cathode electrode by structurally shorting the cathode electrode formed on a non-light emitting region to the auxiliary electrode formed on the lower portion of the cathode electrode by the undercut phenomenon during the fabrication process, making it possible to improve luminance non-uniformity.

BRIEF DESCRIPTION OF THE DRAWINGS

A more complete appreciation of the present invention, and many of the attendant advantages thereof, will be readily apparent as the present invention becomes better understood by reference to the following detailed description when considered in conjunction with the accompanying drawings in which like reference symbols indicate the same or similar components, wherein.

DETAILED DESCRIPTION OF THE INVENTION

Figure 1A:
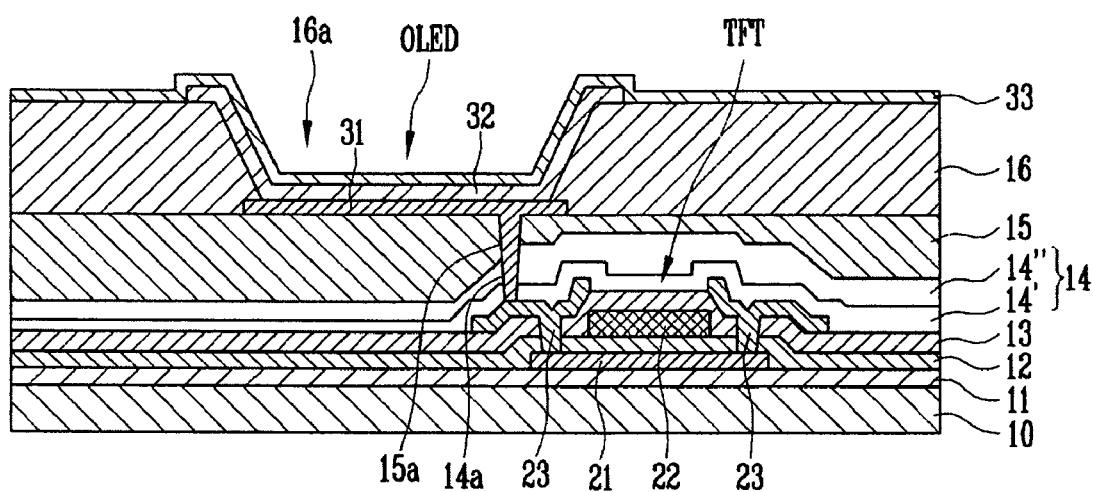
FIGS. 1A and 1B are cross-sectional views of an organic light emitting display according to a first embodiment of the present invention.

In the following detailed description, only certain exemplary embodiments of the present invention have been shown and described, simply by way of illustration. As those skilled in the art would realize, the described embodiments may be modified in various different way, all without departing from the spirit or scope of the present invention. Accordingly, the drawings and description are to be regarded as illustrative in nature and not restrictive. In addition, when an element is referred to as being "on" another element, it can be directly on the element or indirectly on the element with one or more intervening elements interposed therebetween. Also, when an element is referred to as being "connected to" another element, it can be directly connected to the element or be indirectly connected to the element with one or more intervening elements interposed therebetween. Hereinafter, like reference numerals refer to like elements.

Hereinafter, embodiments of the present invention are described in detail with reference to the accompanying drawings.

Figure 1B:
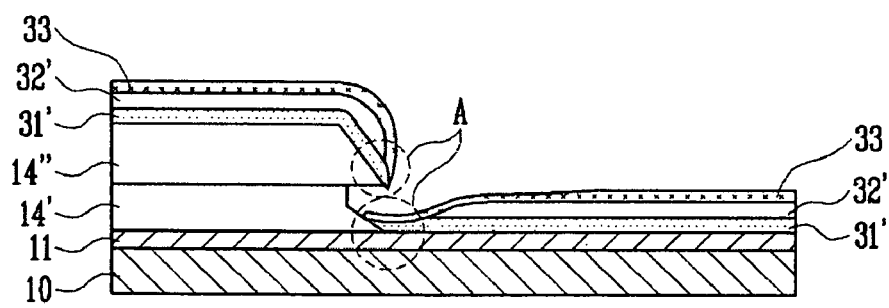

FIGS. 1A and 1B are cross-sectional views of an organic light emitting display according to a first embodiment of the present invention.

FIGS. 1A and 1B respectively show a cross section of a portion of a light emitting region displaying images and a portion of a non-light emitting region not displaying images.

The light emitting region includes a region inside each pixel formed with an EL element and the non-light emitting region includes a region between pixels not formed with the EL element.

Referring to FIG. 1A, the structure of the light emitting region is described below.

A buffer layer 11 is formed on a first substrate 10, and a Thin Film Transistor (TFT) and the EL element as an organic layer are formed thereon.

In other words, a semiconductor active layer 21 with a predetermined pattern is provided on the buffer layer 11 over the first substrate 10. A gate insulating layer 12 is provided on the upper surface of the semiconductor active layer 21 of $SiO_2$, etc. and a gate electrode 22 is formed in a predetermined region on the gate insulating layer 12 as a conductive layer of MoW, Al/Cu, etc. The gate electrode 22 is coupled to a gate line (not shown) supplying TFT on/off signals. An inter-insulator 13 is formed on the gate electrode 22 and the source/drain electrode 23 is formed to contact the source region and the drain region of the semiconductor active layer 21 through a contact hole. A first passivation layer 14' and a second passivation layer 14" are sequentially formed on the source/drain electrode 23.

The first passivation layer 14' and the second passivation layer 14" are formed of materials with different etch rates. As an example, the first passivation layer 14' is formed of $SiO_2$, and the second passivation layer 14" may be formed of SiNx material. The material of the first passivation layer 14' has a higher etch rate as compared to that of the second passivation layer 14".

A planarization layer 15 of an organic material, such as acryl, polyimide, BCB, etc. is formed on the passivation layer 14. The passivation layer 14 and the planarization layer 15 are formed with via holes 14a and 15a linked to the source/drain electrode 23 by photolithography or perforation. A first electrode layer 31 being an anode electrode is formed on the planarization layer 15, so that the first electrode layer 31 is electrically coupled to the source/drain electrode 23. A pixel define layer 16 of an organic layer covering the first electrode layer 31 is formed. After forming a predetermined opening 16a in this pixel define layer 16, an organic layer 32 is formed in a region defined by the opening 16a. The organic layer 32 includes a hole transportation layer, an electron transportation layer, a light emitting layer, etc. as the EL element. The organic layer is referred to as an EL common layer except for the light emitting layer.

A second electrode layer 33 being the cathode electrode is formed to cover the organic layer 32. The organic layer 32 emits light by the injection of holes and electrons from opposite portions of the second electrode 33. The second electrode layer 33 is formed throughout the panel as shown.

However, the organic light emitting display has a disadvantage that the resistance of the cathode electrode, that is, the second electrode layer 33 is large. In other words, as described above, the organic light emitting display is implemented by a top emission scheme so that the second electrode layer 33 is thinly formed to achieve the semitransparent implementation. In this case, the second electrode layer 33 has high resistance.

In order to overcome the foregoing problem, the embodiment of the present invention forms a low-resistance auxiliary electrode on the lower surface of the second electrode layer 33 in the non-light emitting region of the panel and shorts the second electrode layer 33 and the auxiliary electrode within the non-light emitting region to lower the resistance of the second electrode layer 33.

In particular, in shorting the second layer 33 and the auxiliary electrode, they are structurally shorted using the undercut phenomenon generated by the etching of the first and second passivation layers 14 and 14' with different etch rates during the etching process without using a separate mask, thereby lowering the resistance of the second electrode layer 33.

Hereinafter, the structure of the non-light emitting region according to the first embodiment is described with reference to FIG. 1B.

In the non-light emitting region, the buffer layer 11 is formed on the first substrate 10, and the first passivation layer 14' and the second passivation layer 14" with different etch rates described as above are sequentially formed on the buffer layer 11.

The material of the first passivation layer 14' has a higher etch rate as compared to that of the second passivation layer 14". As described above, as one example, the first passivation layer 14' may be formed of $SiO_2$ and the second passivation layer 14" may be formed of SiNx.

Accordingly, if the first passivation layer 14' and the second passivation layer 14" are formed and etched, an undercut is formed as the first passivation layer 14' has a higher etch rate as compared to the second passivation layer 14".

In other words, the first passivation layer 14' is further etched as compared to the second passivation layer 14" formed thereon. Thus, cross sections of the first and second passivation layers 14' and 14" are formed with a step in a reverse taper shape, that is, an undercut shape, as shown in FIG. 1B.

Thereafter, an auxiliary electrode layer 31', an EL common layer 32', and a second electrode layer 33 are sequentially formed throughout the non-light emitting region including the first and second passivation layers 14' and 14" formed with the step of the undercut shape.

For the region formed with the step and the end portion of the step A, as shown in FIG. 1B, the deposition of the auxiliary electrode layer 31', the EL common layer 32', and the second electrode layer 33 cannot be performed properly by the slope of the second passivation layer 14" and/or the first passivation layer 14' in the undercut shape formed on the lower thereof. As a result, the short phenomenon of the auxiliary electrode layer 31' and the second electrode layer 33 occurs.

Assuming that the second electrode layer 33, which is the cathode electrode, is formed of MgAg, the resistance thereof is about 30 Ω.

The embodiment of the present invention forms the auxiliary electrode layer 31' to lower the resistance of the cathode electrode, and the auxiliary electrode layer 31' is formed of the same ITO/Ag as the first electrode layer 31.

The resistance of the ITO/Ag is about 0.50, which is about 1/60 times the second electrode layer 33.

As a result, in the case of the first embodiment of the present invention, the second layer 33 with a high resistance is shorted at the end portion of the step of the first and second passivation layers 14' and 14", so that the resistance of the second layer 33 is considerably reduced. Thus, the voltage drop generated by the second electrode layer 33 is reduced, making it possible to lower the luminance non-uniformity.

Figure 2A:
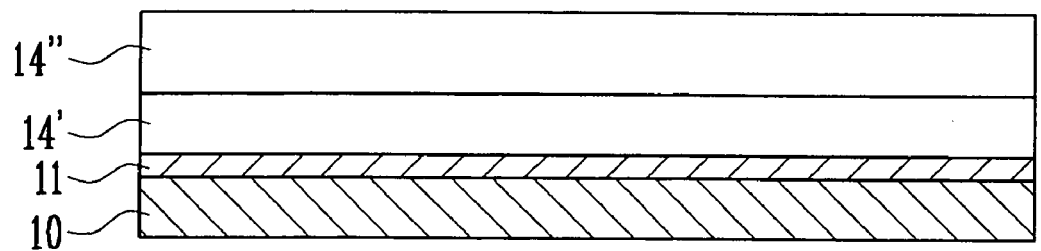
FIGS. 2A to 2C are cross-sectional views of processes in fabricating an organic light emitting display according to the first embodiment of the present invention.
Figure 2B:
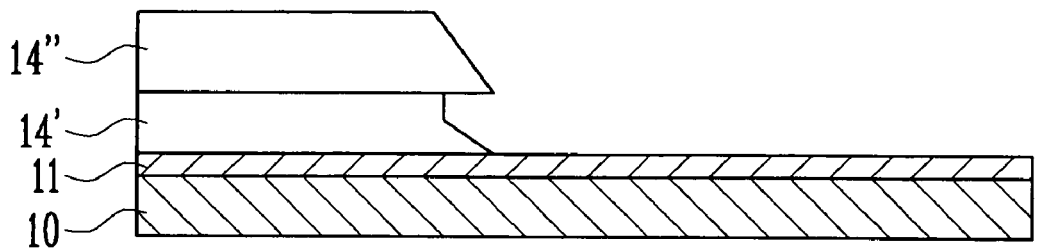
Figure 2C:
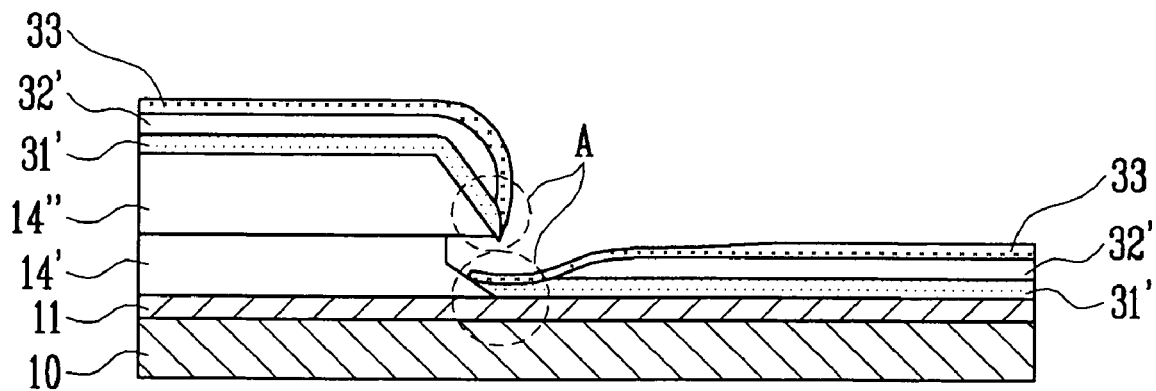

FIGS. 2A to 2C are cross-sectional views of a process of fabricating an organic light emitting display according to the embodiment of FIG. 1.

However, the characteristic of the present invention is the structural shorting of the cathode electrode and the auxiliary electrode formed therebelow as described above, and therefore, for convenience, only the fabrication process in the non-light emitting region is described in FIGS. 2A to 2C.

First, as shown in FIG. 2A, the first and second passivation layers 14' and 14" are sequentially formed on the first substrate 10 having the buffer layer 11 previously formed thereon.

The material of the first passivation layer 14' has a higher etch rate as compared to that of the second passivation layer 14". As described above, as one example, the first passivation layer 14' may be formed of $SiO_2$, and the second passivation layer 14" may be formed of SiNx.

Next, referring to FIG. 2B, an etching process is performed on the first passivation layer 14' and the second passivation layer 14".

The etching process is preferably performed by a dry etch method. If a BOE processing is completed after the etch, the first passivation layer 14' has a higher etch rate than the second passivation layer 14", so that an undercut is formed as shown.

In other words, the first passivation layer 14' is further etched as compared to the second passivation layer 14" formed thereon so that the cross sections of the first and second passivation layers 14' and 14" have steps as shown.

Thereafter, as shown in FIG. 2C, the auxiliary electrode layer 31', the EL common layer 32', and the second electrode layer 33 are sequentially formed throughout the non-light emitting region including the first and second passivation layers 14' and 14" formed with the steps having a reverse taper.

Herein, assuming the second electrode layer 33, which is the cathode electrode, is formed of MgAg, the resistance thereof is about 30 Ω.

Thus, the embodiment of the present invention forms the auxiliary electrode layer 31' to lower the resistance of the cathode electrode, and the auxiliary electrode layer 31' is formed of the same ITO/Ag as the first electrode layer 31.

The resistance of the ITO/Ag is about 0.50, which is about 1/60 times the second electrode layer 33.

Also, the EL common layer 32' refers to an organic layer except for the light emitting layer for the organic layer as the EL element and does not emit light by the removal of the light emitting layer.

As shown in FIG. 2C, the region formed with the step, in particular, at the end portion of the step A, the deposition of the auxiliary electrode layer 31', the EL common layer 32', and the second electrode layer 33 cannot be performed properly by the slope of the second passivation layer 14" and/or the first passivation layer 14' in the undercut shape formed on the lower thereof. As a result, the short phenomenon of the auxiliary electrode layer 31' and the second electrode layer 33 occurs.

Figure 3:
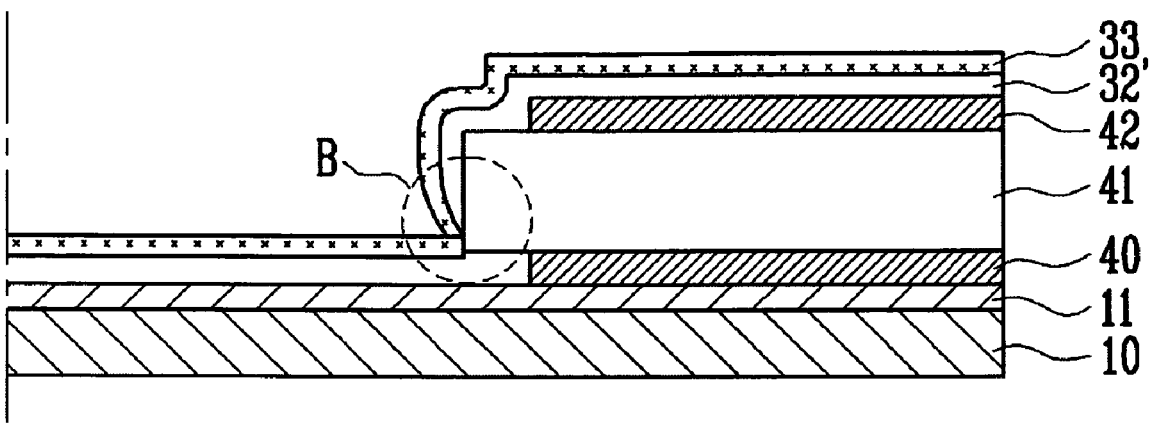
FIG. 3 is a cross-sectional view of an organic light emitting display according to a second embodiment of the present invention.

FIG. 3 is a cross-sectional view of an organic light emitting display according to a second embodiment of the present invention.

The structure of the light emitting region is almost the same as the structure of the light emitting region described with reference to FIG. 1 except that the passivation layer 14 is formed in a single layer structure, not a double layer structure in the present embodiment, and therefore a detailed description thereof has been omitted. FIG. 3 is a cross section of only a portion of the non-light emitting region.

In the non-light emitting layer, the buffer layer 11 is formed on the first substrate 10, and at least two auxiliary electrode layers 40, 41 and 42 with different etch rates are formed on the buffer layer 11.

In the embodiment of the present invention, the structure that the auxiliary electrode layers 40, 41 and 42 formed of Mo/Al/Mo are sequentially stacked is described as an example.

In other words, the first auxiliary electrode layer 40 of Mo material, the second auxiliary electrode layer 41 of Al, and the third auxiliary electrode layer 42 of Mo are sequentially stacked. Herein, the materials of the first and third auxiliary electrode layers 40 and 42 have higher etch rates as compared to that of the second auxiliary electrode layer 41.

Therefore, if the first to third auxiliary electrode layers 40, 41, and 42 are sequentially formed and etched, an undercut is formed since the second auxiliary electrode layer 41 has a lower etch rate as compared to the first and third auxiliary electrode layers 40 and 42.

In other words, the first and third auxiliary electrode layers 40 and 42 are further etched as compared to the second auxiliary electrode layer 41 formed therebetween, so that the cross sections of the first to third auxiliary electrode layer 40 to 42 have a step as shown in FIG. 3.

Thereafter, the EL common layer 32' and the second electrode layer 33 are sequentially formed throughout the non-light emitting region including the first to third auxiliary electrode layers 40 to 42 formed with the step.

In the region formed with the step, in particular, at the end portion B of the second auxiliary electrode layer 41 having a projected shape as compared to the first to third auxiliary electrode layers 40, 42, as shown in FIG. 3, the deposition of the EL common layer 32' and the second electrode layer 33 cannot be performed properly. Therefore, the short phenomenon of the second auxiliary electrode layer 41 and the second electrode layer 33 occurs.

Assuming that the second electrode layer 33, which is the cathode electrode, is formed of MgAg, the resistance thereof is about 30 Ω.

The embodiment of the present invention forms the auxiliary electrode layers 40, 41, and 42 to lower the resistance of the cathode electrode and the resistance of the auxiliary electrode layers 40, 41, and 42 formed of Mo/Al/Mo is about 0.07 Ω, which is about 1/500 times the second electrode layer 33.

As a result, in the case of the second embodiment of the present invention, the second electrode layer 33 with high resistance is shorted at the step of the second auxiliary electrode layer 41, so that the resistance thereof is considerably reduced. Thus, the voltage drop (IR drop) generated by the second electrode layer 33 is considerably reduced, thereby reducing the luminance non-uniformity.

Figure 4A:
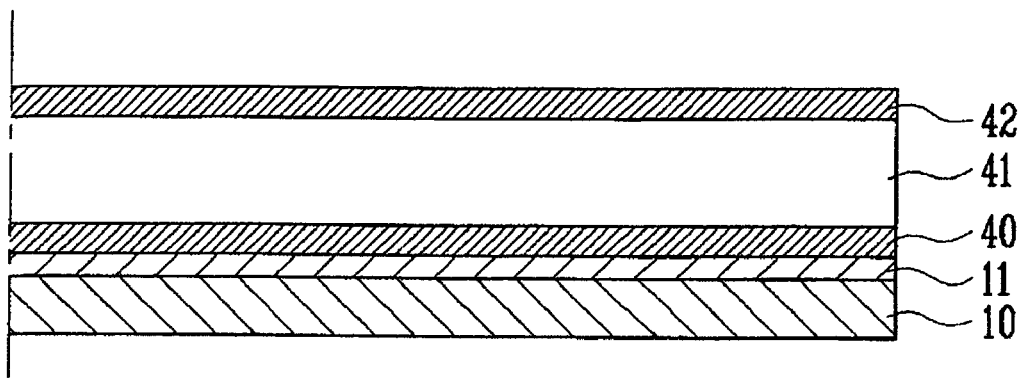
FIGS. 4A to 4C are cross-sectional views of processes in fabricating an organic light emitting display according the second embodiment of the present invention.
Figure 4B:
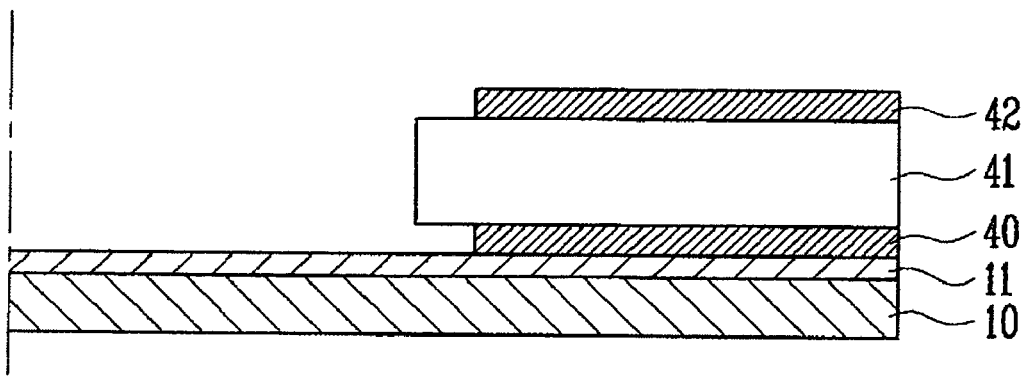
Figure 4C:
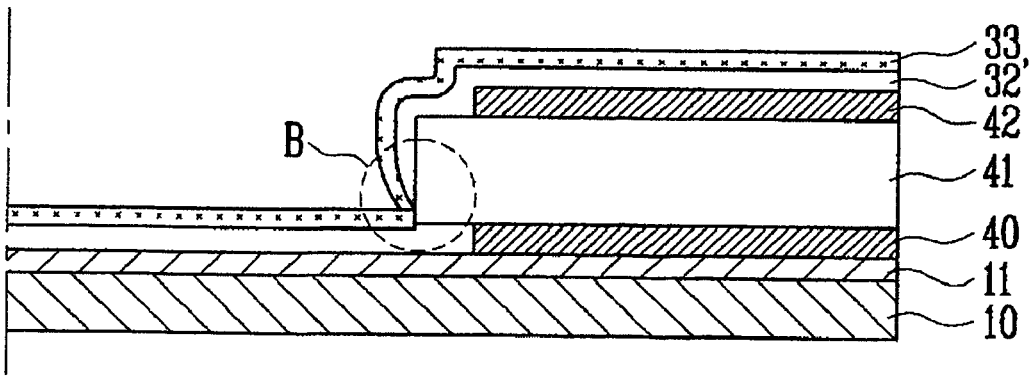

FIGS. 4A to 4C are cross-sectional views of processes of fabricating an organic light emitting display according an embodiment of the present invention.

First, as shown in FIG. 4A, auxiliary electrode layers 40, 41, and 42 having different etch rates are formed on a first substrate 10 having a buffer layer 11 formed thereon.

In the embodiment of the present invention, the structure that the auxiliary electrode layers 40, 41, and 42 formed of Mo/Al/Mo are sequentially stacked is described as an example.

In other words, the first auxiliary electrode layer 40 of Mo, the second auxiliary electrode layer 41 of Al, and the third auxiliary electrode layer 42 of Mo are sequentially stacked. Herein, the material of the first and third auxiliary electrode layers 40 and 42 has larger etch rates as compared to that of the second auxiliary electrode layer 41.

Next, referring to FIG. 4B, the etch process is performed on the first to third auxiliary electrode layers 40, 41, and 42.

The etch process is preferably performed by a dry etch method. If a BOE processing is completed after the etching, the second passivation layer 41 has a lower etch rate than the first and third passivation layers 40 and 42, so that an undercut is formed.

In other words, the first and third auxiliary electrode layers 40 and 42 are further etched as compared to the second auxiliary electrode layer 41 formed therebetween, so that the cross sections of the first to third auxiliary electrode layers 40, 41, and 42 have a step as shown in FIG. 3.

Thereafter, as shown in FIG. 4C, the EL common layer 32' and the second electrode layer 33 are formed throughout the non-light emitting including the first to third auxiliary electrode layers 40, 41, and 42 formed with the step as shown in FIG. 4C.

Herein, assuming that the second electrode layer 33, which is the cathode electrode, is formed of MgAg, the resistance thereof is about 30 Ω.

Also, the EL common layer 32' refers to an organic layer except for the light emitting layer for the organic layer as the EL element and does not emit light by the removal of the light emitting layer.

In the region formed with the step, in particular, at the end portion B of the second auxiliary electrode layer 41 having a projected shape as compared to the first to third auxiliary electrode layers 40 and 42, as shown in FIG. 4C, the deposition of the EL common layer 32' and the second electrode layer 33 cannot be performed properly. Therefore, the short phenomenon of the second auxiliary electrode layer 41 and the second electrode layer 33 occurs.

While the present invention has been described in connection with certain exemplary embodiments, it is to be understood that the present invention is not limited to the disclosed embodiments, but, on the contrary, is intended to cover various modifications and equivalent arrangements included within the spirit and scope of the appended claims.

What is claimed is:

1. An organic light emitting display device, comprising:
    a light emitting region and a non-light emitting region, the non-light emitting region including:
    a first substrate;
    a first passivation layer and a second passivation layer sequentially arranged on the first substrate and the first and second passivation layers together forming a step exhibiting an undercut shape; and
    an auxiliary electrode layer, an ElectroLuminescent (EL) common layer, and a second layer sequentially arranged throughout the non-light emitting region including the first and second passivation layers, the auxiliary electrode layer being shorted to the second layer in the step at the slope of the second passivation layer.

2. The organic light emitting display device as claimed in claim 1, wherein the first passivation layer has a higher etch rate than that of the second passivation layer.

3. The organic light emitting display device as claimed in claim 1, wherein the first passivation layer comprises an $SiO_2$ material, and the second passivation layer comprises silicon nitride.

4. The organic light emitting display device as claimed in claim 3, wherein a second electrode layer comprises a cathode electrode of MgAg.

5. The organic light emitting display device as claimed in claim 1, wherein the auxiliary electrode layer and an anode electrode each comprise ITO/Ag.

6. A method of fabricating an organic light emitting display device of claim 1, comprising:
   sequentially forming first and second passivation layers with different etch rates on a first substrate;
   etching the first and second passivation layers to form a step in an undercut shape; and
   sequentially forming an auxiliary electrode layer, an ElectroLuminescent (EL) electrode layer, and a second electrode layer throughout a non-light emitting region of the display device including the first and second passivation layers, the auxiliary electrode layer being shorted to the second layer in the step at the slope of the second passivation layer or shorted to the first passivation layer in the undercut shape arranged under the second passivation layer.

7. The method as claimed in claim 6, wherein the first passivation layer has a higher etch rate than that of the second passivation layer.

8. The organic light emitting display of claim 1, wherein the auxiliary electrode layer is shorted to the first passivation layer in the undercut shape arranged under the second passivation layer.

9. An organic light emitting display device, comprising:
   a light emitting region and a non-light emitting region, the non-light emitting region including:
   a first substrate;
   a first auxiliary electrode layer, a second auxiliary electrode layer, and a third auxiliary electrode layer sequentially arranged on the first substrate and the first and second and third auxiliary electrode layers forming a step exhibiting an undercut shape; and
   an ElectroLuminescent (EL) common layer and a second layer sequentially arranged throughout the non-light emitting region including the first, second, and third auxiliary layers, the first, second, and third auxiliary electrode layers being shorted to the second layer in the step corresponding to an end portion of the second auxiliary electrode layer having a projected shape as compared to that of the first and third auxiliary electrode layers.

10. The organic light emitting display device as claimed in claim 9, wherein the first and third auxiliary electrode layers each have a higher etch rate than that of the second auxiliary electrode layer.

11. The organic light emitting display device as claimed in claim 9, wherein the first, second, and third auxiliary electrode layers each comprise sequentially arranged Mo/Al/Mo.

12. The organic light emitting display device as claimed in claim 9, wherein a second electrode comprises a cathode electrode of MgAg.

13. A method of fabricating an organic light emitting display device of claim 9, comprising:
   sequentially forming first, second, and third auxiliary electrode layers on a first substrate, the first, second, and third auxiliary electrode layers each having different etch rates;
   etching the first, second, and third auxiliary electrode layers to form a step in an undercut shape;
   sequentially forming an ElectroLuminescent (EL) electrode layer and a second electrode layer throughout a non-light emitting region including the first, second, and third auxiliary layers, the first, second, and third auxiliary electrode layers being shorted to the second layer in the step corresponding to an end portion of the second auxiliary electrode layer having a projected shape as compared to that of the first and third auxiliary electrode layers.

14. The method as claimed in claim 13, wherein the first and third auxiliary electrode layers each have a higher etch rate than that of the second auxiliary electrode layer.

* * * * *